(12) United States Patent
Boulanger et al.

(10) Patent No.: US 8,351,179 B2
(45) Date of Patent: Jan. 8, 2013

(54) SOLAR GENERATOR WITH CONCENTRATOR OF PRIMARY ELECTRIC ARCS

(75) Inventors: Bernard Boulanger, Frejus (FR); Claude Berthou, La Roquette sur Siagne (FR)

(73) Assignee: Thales, Neuilly sur Seine (FR)

( * ) Notice: Subject to any disclaimer, the term of this patent is extended or adjusted under 35 U.S.C. 154(b) by 705 days.

(21) Appl. No.: 12/160,685

(22) PCT Filed: Jan. 9, 2007

(86) PCT No.: PCT/FR2007/050628
§ 371 (c)(1),
(2), (4) Date: Oct. 6, 2009

(87) PCT Pub. No.: WO2007/083050
PCT Pub. Date: Jul. 26, 2007

(65) Prior Publication Data
US 2010/0163093 A1    Jul. 1, 2010

(30) Foreign Application Priority Data
Jan. 20, 2006  (FR) ...................... 06 50212

(51) Int. Cl.
*H05F 3/00* (2006.01)

(52) U.S. Cl. ........ 361/218; 361/212; 361/220; 136/244; 136/246

(58) Field of Classification Search .................. 361/218, 361/212, 220; 136/244, 246
See application file for complete search history.

(56) References Cited

U.S. PATENT DOCUMENTS

| | | | |
|---|---|---|---|
| 5,583,748 A | 12/1996 | Gochi et al. | |
| 5,620,529 A * | 4/1997 | Bassily et al. | 136/245 |
| 6,093,884 A * | 7/2000 | Toyomura et al. | 136/244 |
| 6,248,950 B1 * | 6/2001 | Hoeber et al. | 136/251 |
| 6,355,875 B1 * | 3/2002 | Kamimura | 136/256 |
| 6,856,097 B2 * | 2/2005 | Onishi | 315/169.1 |
| 7,339,108 B2 | 3/2008 | Tur et al. | |

FOREIGN PATENT DOCUMENTS

| | | |
|---|---|---|
| DE | 3733645 | 4/1989 |
| DE | 19821368 | 11/1999 |
| EP | 0995676 | 4/2000 |
| FR | 2701786 | 8/1994 |
| GB | 2224391 | 5/1990 |
| JP | 60189272 | 2/1986 |
| JP | 7147378 A | 6/1995 |
| JP | 2003212198 A | 7/2003 |
| WO | WO9938217 | 7/1999 |

OTHER PUBLICATIONS

Japanese Refusing Reason Notice for JP2008-550813, mailed Mar. 27, 2012.

* cited by examiner

*Primary Examiner* — Rexford Barnie
*Assistant Examiner* — Toan Vu
(74) *Attorney, Agent, or Firm* — Lowe, Hauptman, Ham & Berner, LLP

(57) ABSTRACT

A (GS) for an equipment (EQ) including an electrical reference (ME) and including an area provided with at least two photoelectric cells (C) electrically connected and each covered by a protective window that can become electrostatically charged. This solar generator further includes, on the one hand, at at least one chosen place (EC) of the area, intensification means (MI) responsible for locally intensifying the electrostatic charge so as to force the generation of primary electrical arcs at that chosen place, and, on the other hand, discharging means (EL, LM) adapted to couple the intensification means (MI) to the electrical reference (ME) of the equipment (EQ) so as to evacuate to that electrical reference (ME) discharge currents induced by the primary electrical arcs.

18 Claims, 1 Drawing Sheet

SOLAR GENERATOR WITH CONCENTRATOR OF PRIMARY ELECTRIC ARCS

CROSS-REFERENCE TO RELATED APPLICATIONS

The present Application is based on International Application No. PCT/FR2007/050628, filed on Jan. 9, 2007, which in turn corresponds to French Application No. 0650212, filed on Jan. 20, 2006, and priority is hereby claimed under 35 USC §119 based on these applications. Each of these applications are hereby incorporated by reference in their entirety into the present application.

FIELD OF THE INVENTION

The invention concerns solar generators, especially those on board spacecraft, such as satellites, for example.

BACKGROUND OF THE INVENTION

Solar generators usually include electrically connected photoelectric cells each covered by a protective window (or screen or filter). These protective windows (or screens) are intended to protect the photoelectric cells from some kinds of radiation, for example streams of protons and/or electrons, in order to guarantee them a certain service life. Moreover, these protective windows (or screens) having to allow photons to pass through them, they are generally made from a glass material (for example of the "coverglass" type) and glued by means of a transparent glue or adhesive that is not electrically conductive. As these materials are not electrically conductive, they tend to acquire an electrostatic charge, which sometimes causes localized electrical arcing known as primary electrical arcing (or electrostatic discharge (ESD)) between its protective window and the photoelectric cell that it covers or an adjacent photoelectric cell.

Here the expression "protective window" refers to the assembly including the material for protecting the cell (for example the coverglass) and its glue or its adhesive.

As the person skilled in the art knows, a primary electrical arc is in two parts.

The first part is known as the "blow-off". It takes the form of a current induced by the rapid discharging of the general capacitance of the equipment (for example a satellite) on which the solar generator is installed.

The second part is known as "flash-over". It takes the form of a current induced by the slow discharging of the protective windows of at least some of the photoelectric cells, by a progressive propagation mechanism at a speed of the order of $10^4$ m/s. This propagation mechanism travels from the protective windows of the cells that are mounted in series to constitute a branch to the protective window of the cell that is the site of the primary electrical arc, because of the plasma that is created between the protective windows of adjacent cells. It also travels from the protective windows of the cells that are part of branches adjacent to the branch containing the cell that is the site of the primary electrical arc to the protective window of the latter cell, because of the plasma and of the circulation of the slow discharge current from the branch that is the site of the primary electrical arc to the adjacent branches, via their electrical connections. The slow discharge current generally circulates via the ends of the branches that are of negative polarity, given that their opposite ends, of positive polarity, are generally provided with current blocking means such as diodes.

This flash-over (or slow discharge) can damage some of the photoelectric cells if its duration exceeds a threshold that depends on the material from which they are produced. This is the case in particular when the photoelectric cells are produced in a semiconductor material such as gallium arsenide (AsGa) and the duration of the flash-over (or slow discharge) is more than approximately 100 µs. This damage reduces the service life of the photoelectric cells (and thus reduces their reliability), which is particularly problematical if they cannot be replaced.

SUMMARY OF THE INVENTION

The invention therefore has the aim of at least partly remedying the aforementioned drawback.

To this end it proposes a solar generator for an equipment including an electrical reference and including an area provided with at least two photoelectric cells electrically connected and each covered by a protective window FP that can become electrostatically charged.

This solar generator is characterized in that it includes:
- at at least one chosen place of the area intensification means responsible for locally intensifying the electrostatic charge so as to force the generation of primary electrical arcs at that chosen place, and
- discharging means adapted to couple the intensification means to the electrical reference of the equipment so as to evacuate to that electrical reference discharge currents induced by the primary electrical arcs.

Thus the intensification means act in a similar manner to a "lightning rod" by localizing the primary electrical arcs at a place chosen so that the discharge currents that they induce can be evacuated by the discharge means without damaging the photoelectric cells of the active array of the solar generator.

The solar generator of the invention can have other features and in particular, separately or in combination:
- its intensification means can consist of at least one protective window consisting of a combination of a dielectric protective material stuck by electrically insulative adhesion means (glue or adhesive);
- each protective window of the intensification means can for example be produced in at least one material having dielectric properties different from those of the corresponding material in which are produced at least some of the protective windows of the photoelectric cells; this material can for example be more electrically insulative and/or have greater secondary emission properties;
- in a first variant, each protective window of the intensification means is produced in a protective material identical to that in which are produced the protective windows of the photoelectric cells (for example coverglass), and the thickness of the protective material of each protection window of the intensification means is chosen in this case to be strictly greater than the thickness of the protective materials of the photoelectric cells;
- in a second variant, each protective window of the intensification means can for example be produced in a protective material (identical or not to that usually employed for the protective windows) and associated with a glue or an adhesive having a thickness greater than that usually employed for the protective windows or associated with a glue or an adhesive having a higher electrical resistivity;
- in a third variant, each protective window of the intensification means can include an electrically floating metal exposed to vacuum so as to form a "metal-vacuumdielectric" triple point favorable to the occurrence of an electrostatic discharge; this floating metal can be situated on the internal face of the protective material, for example, or even its external face, or on the adhesive or the glue;

it can include a plurality of panels each including a plurality of photoelectric cells electrically connected to each other, and in this case the intensification means are installed in at least one chosen place on at least one of the panels;

the intensification means can be installed in at least one chosen place situated on the panel intended to be at the greatest distance from the support structure of the equipment;

its discharging means can for example include an electrode situated in the vicinity of the intensification means and a grounding line connected to the electrode and adapted to be coupled to the electrical reference of the equipment;

the grounding line can be coupled to measuring means responsible for measuring the intensities and/or durations and/or creation dates and/or creation frequencies of the discharge currents;

it can include insulating means adapted to insulate the grounding line electrically from the rest of the solar generator;

the electrode can for example consist of a conductive plate including a central part and a peripheral part fastened to the intensification means;

the electrode can be a photoelectric cell fastened to a rear face of the intensification means and electrically disconnected from the other photoelectric cells;

its photoelectric cells can be produced in semiconductor materials, for example gallium arsenide (AsGa).

The invention is particularly well adapted, although not exclusively so, to spacecraft, and in particular to satellites.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE INVENTION

An object of the invention is to concentrate primary electrical arcs (or electrostatic discharges (ESD)) induced by the accumulation of electrostatic charges on the protective windows of the photoelectric cells of the solar generators because they are produced in a material that is not electrically conductive.

It is considered by way of nonlimiting example hereinafter that the solar generator is intended to be installed on a spacecraft, such as a satellite, for example. However, the invention is not limited to that application. It concerns any type of equipment or system that has an electrical reference and at least one solar generator (i.e. an equipment having differential active voltages exposed to vacuum, like an active antenna) likely to be the site of primary electrical arcs.

What is more, the invention applies if the solar generator includes at least one area in which are installed at least two photoelectric cells, electrically connected and each covered by a protective window that can become electrostatically charged.

Figure 1:
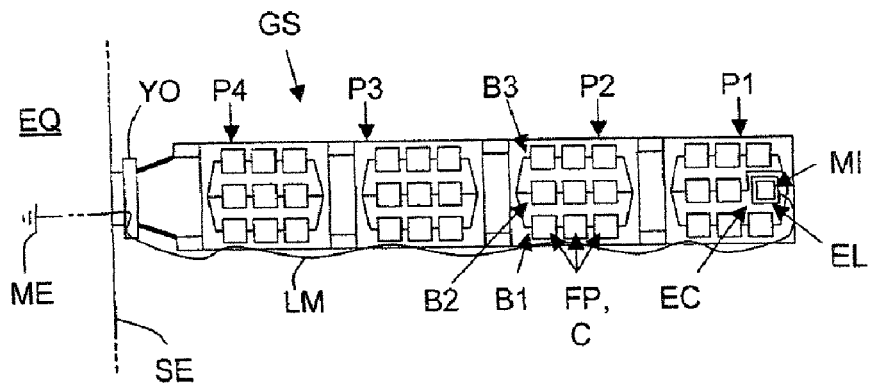
FIG. 1 shows very diagrammatically and functionally one embodiment of a solar generator of the invention fastened to the structure of an equipment.

In the nonlimiting example shown in FIG. 1, the solar generator GS includes four panels Pi (i=1 to 4) mechanically and electrically connected to each other. One of the panels, here P4, is connected to the structure SE of the craft (or equipment) EQ via an articulated support YO known as a "yoke".

Each panel Pi includes a set of at least two photoelectric cells C electrically connected in series or in parallel. The sets of panels Pi are generally electrically connected to each other. In the example shown in the FIG. 2 grounding diagram, the sets of photoelectric cells C are connected to the electrical reference ME of the craft. Moreover, each panel Pi is connected to two electrical grounding lines GL1 and GL2 via two resistors (R1 and R2 for the panel P1, R3 and R4 for the panel P2, R5 and R6 for the panel P3, and R7 and R8 for the panel P4). The articulated support (or yoke) YO and the motor MR for driving the panels Pi are mounted in series and connected to the two electrical grounding lines GL1 and GL2. What is more, the two electrical grounding lines GL1 and GL2 are connected to the electrical reference ME of the craft EQ via respective resistors R9 and R10. This electrical reference ME is the zero voltage (0 V) of the control bus of the craft EQ.

Figure 2:
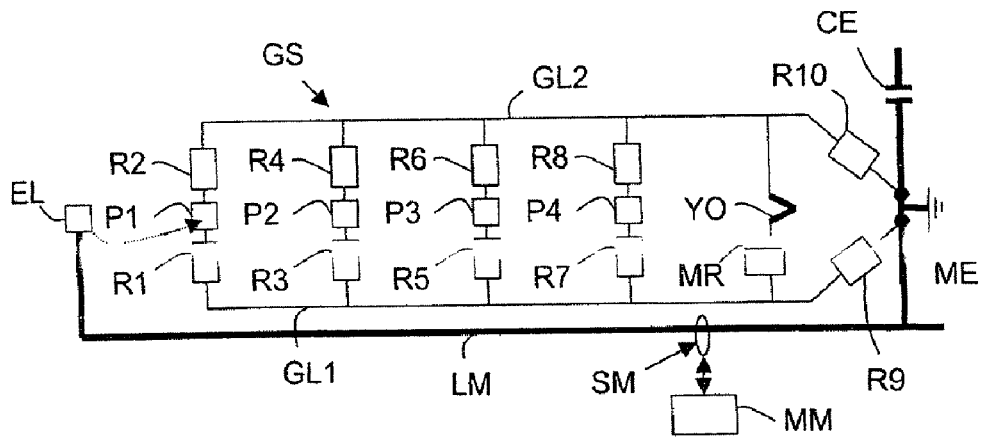
FIG. 2 shows very diagrammatically and functionally a representation in the form of a grounding circuit of the solar generator shown by way of example in FIG. 1, FIGS. 3A and 3B show very diagrammatically a view in section and a plan view, respectively, of one embodiment of a discharge electrode/intensification means assembly.

Finally, in the FIG. 2 grounding diagram, the capacitor CE connected to the electrical reference ME of the craft EQ represents the latter's electrical capacitance.

In the nonlimiting example shown in FIG. 1, each set of photoelectric cells C includes three branches B1 to B3 electrically connected in parallel and including at least two photoelectric cells C electrically connected to each other in series. This type of assembly is merely one example, of course. Any combination of at least two photoelectric cells C can constitute a set of photoelectric cells C installed in an area of a panel Pi.

Each active photoelectric cell C, i.e. each cell contributing to the generation of electrical current within a solar generator GS, can be produced in a semiconductor material. For example, they are of gallium arsenide (AsGa) type. In this case they can be of single-junction or multijunction type. However, the photoelectric cells could equally be of silicon type.

What is more, each active photoelectric cell C includes a front face covered with a protective window (or screen) FP (for example of the coverglass type). The invention concerns any type of protective window (or screen) FP liable to be the site of an accumulation of electrostatic charges and thus of primary electrical arcs (or electrostatic discharges (ESD)), according to the definition given in the introduction.

As mentioned above, the invention proposes to concentrate in at least one chosen place EC of the area containing the active photoelectric cells C the primary electrical arcs that are induced by the accumulation of electrostatic charges on the protective windows FP of these active photoelectric cells C.

To be more precise, the invention proposes first of all to install intensification means MI for locally intensifying the electrostatic charge in at least one chosen place EC of the area containing the active photoelectric cells C of at least one of the solar generators GS of an equipment (or craft or system) EQ, in order to force the generation of primary electrical arcs at this chosen place EC. The invention also proposes to couple the intensification means MI to the electrical reference ME of the craft EQ via discharge means EL and LM in order to evacuate to the electrical reference ME the discharge currents that are induced by the primary electrical arcs generated locally because of the presence of the intensification means MI.

It is therefore not a question of eliminating the primary electrical arcs, but of creating, in at least one chosen place EC of the area containing the active photoelectric cell C, local dielectric conditions forcing the generation of the primary electrical arcs, if possible almost all of them. In other words, there is constituted locally at each chosen place a kind of "lightning rod" for concentrating the generation of the primary electrical arcs in order for the discharge currents that they induce to be evacuated by the discharge means EL and LM. The primary electrical arcs no longer reaching (or virtually no longer reaching) the active photoelectric cells C, they do not degrade them.

If the solar generator GS includes a number of panels Pi, the intensification means MI are preferably installed in at least one chosen place situated on the panel Pi that is likely to become the most highly charged. For example, if the solar generator GS equips a spacecraft EQ such as a satellite, the intensification means MI are preferably installed on the panel P1 that is at the greatest distance from the supporting structure SE of the spacecraft EQ, as shown in FIGS. 1 and 2.

The intensification means MI are preferably produced in the form of at least one protective window. This can be produced in the same protective material as is usually employed for the protective windows FP of the active photoelectric cells C (for example coverglass). In this case, and to create dielectric conditions favorable to the local concentration of the primary electrical arcs, each protective window of the intensification means MI has a chosen thickness strictly greater than the thickness of the protection windows FP of the active photoelectric cells C. For example, if coverglass protective windows FP are used having a thickness of 100 to 150 µm, each protective window of the intensification means MI can have a thickness greater than 150 or 200 µm, for example 300 or 500 µm.

Increasing the thickness of the glue or the adhesive under the protective material relative to the thickness usually employed for protective windows can also be envisaged.

There can also be associated with the protective material an electrically floating metal, exposed to vacuum, to create conditions known as "metal-vacuum-dielectric" triple point conditions favorable to the occurrence of electrical discharges. The floating metal can be on the internal face of the protective material, for example, or even on its external face, or on the adhesive or the glue.

Some satellite equipments, other than the solar generators, such as active antennas, for example, have such "metal-vacuum-dielectric" triple points exposed directly to space with the presence of active voltages, i.e. voltages positively or negatively referenced directly to the power generation or conditioning system of the satellite. These equipments (for example active antennas) can therefore be protected from discharges by concentrating the latter in the intensification means of the invention.

However, it can equally be envisaged that each protective window of the intensification means MI is produced in protective (dielectric) materials different from those used for the protective windows FP of the active photoelectric cells C (for example coverglass and/or glue (or adhesive)). In this case, the dielectric materials of each protective window of the intensification means MI must be in particular more electrically insulative and/or have greater secondary emission than the protective windows FP of the active photoelectric cells C.

It will be noted that the intensification means MI can consist of a plurality of (at least two) adjacent protective windows, preferably close to each other.

The discharge means EL, LM preferably include an electrode EL situated in the vicinity of the intensification means MI and a grounding line LM connected to the electrode EL and (intended to be) coupled to the electrical reference ME of the craft EQ.

The grounding line LM is an electrical cable that is preferably insulated, if possible double-insulated, in order to be perfectly electrically insulated from the remainder of the solar generator GS. This (double) insulation is obtained by (double) sheathing, for example.

To control the discharge currents (induced by the primary electrical arcs) that are evacuated by the grounding line LM, the latter can be coupled to measuring means. For example, the measuring means can include a measurement probe SM coupled to the grounding line LM and a measuring module MM coupled to the measuring probe SM to detect the waveforms of the discharge currents. Thanks to these waveforms, the measuring module MM can measure the intensities and/or durations and/or creation dates and/or creation frequencies of the discharge currents and store this information in memory for subsequent analysis, possibly in a ground station after transfer by radio.

Figure 3A:
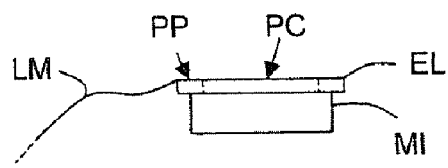
Figure 3B:
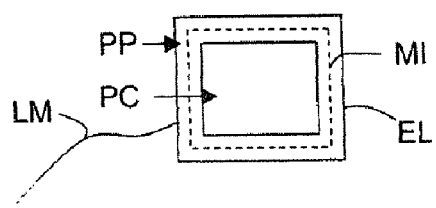

As shown diagrammatically in FIGS. 3A and 3B, the electrode EL can consist of a conductive plate, for example, including a central part PC (possibly apertured) and a peripheral part PP fastened to the intensification means MI and connected to the grounding line LM. The peripheral part PP of the conductive plate EL is for example glued to the front face (facing into space) of the protective window of the intensification means MI.

The conductive plate EL can be produced in a conductive material such as aluminum or silver, for example.

Instead of being produced in the form of a conductive plate, the electrode EL can be one of the photoelectric cells installed on a panel Pi, for example. In this case, there is of course used as the electrode a photoelectric cell that is not active, i.e. that is electrically disconnected from the active photoelectric cells C and therefore does not contribute to the generation of current.

In this case the inactive photoelectric cell serving as the electrode EL includes a front face (opposite the panel Pi) fastened (for example glued) to the rear face of the protective window constituting all or part of the intensification means MI. Moreover, this inactive photoelectric cell EL is then connected to the grounding line LM instead of being electrically connected to all of the active photoelectric cells C installed on its panel Pi.

If an equipment EQ includes a plurality of solar generators, it is not obligatory for each of them to be of the type described above (i.e. provided with intensification means MI and discharging means EL and LM). What is important is for at least one of the solar generators to conform to the invention, the other(s) either conforming to the invention or being of standard type (i.e. having no intensification means MI and no discharging means EL and LM). The number of solar generators GS of the invention in an equipment EQ and the number of places chosen and their respective positions within each solar generator GS of the invention depend on the mission of the equipment EQ and the conditions of use (positions and environment) of each of its solar generators.

The invention offers a number of advantages, and in particular:
- it provides a reliable supply of power from the active photoelectric cells,
- it avoids preliminary statistical studies in relation to the impact of the primary electrical arcs on the power losses of the active photoelectric cells,
- it avoids carrying out preliminary tests to characterize the deterioration of the active photoelectric cells as a function of the primary electrical arcs,
- it limits ESD qualification tests to dense plasmas (ionosphere or plasma from electrical propulsion units).

The invention is not limited to the solar generator GS and equipment EQ embodiments described hereinabove by way of example only, but encompasses all variants that the person skilled in the art might envisage within the scope of the following claims.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A solar generator for equipment including an electrical reference and including an area provided with at least two photoelectric cells electrically connected and each covered by a protective window that can become electrostatically charged, comprising
   i) at least one intensification means disposed in at least one chosen place adapted to intensify locally the electrostatic charge so as to force the generation of primary electrical arcs at the at least one chosen place, and
   ii) discharging means comprising an electrode situated in a vicinity of the at least one intensification means and a ground line connected to the electrode, wherein the discharging means directly connects said intensification means to said electrical reference of said equipment so as to evacuate to that electrical reference discharge currents induced by said primary electrical arcs.

2. The solar generator as claimed in claim 1, wherein said at least one intensification means have at least one window comprising a dielectric material stuck by electrically insulative adhesion means to said at least one window.

3. The solar generator as claimed in claim 2, wherein each window of said at least one intensification means comprises at least one material having dielectric properties different from those of the corresponding material of each protective window of said at least two photoelectric cells.

4. The solar generator as claimed in claim 2, wherein each window of said at least one intensification means comprises a protective material identical to a protective material of the protection windows of said photoelectric cells, and in that the thickness of the protective material of each protection window of said intensification means is greater than a thickness of the protective material of each protective window of said at least two photoelectric cells.

5. The solar generator as claimed in claim 2, wherein each window of said at least one intensification means comprises a protective material identical to a protective material of each protective window of said at least two photoelectric cells, wherein a thickness of said electrically insulative adhesion means of each window of said at least one intensification means is greater than a thickness of an adhesion means of each protective window of said at least two photoelectric cell.

6. The solar generator as claimed in claim 2, wherein each protective window of said intensification means includes an electrically floating metal exposed to a vacuum so as to form a metal-vacuum-dielectric triple point favorable to the occurrence of an electrostatic discharge.

7. The solar generator as claimed in claim 1, further comprising a plurality of panels, each including a plurality of photoelectric cells configured to electrically connect to each other, wherein said at least one intensification means is installed in at least one chosen place in at least one of said panels.

8. The solar generator as claimed in claim 7, wherein said at least one intensification means is installed in at least one chosen place situated on the at least one of said panels at a greatest distance from a support structure of said equipment.

9. The solar generator as claimed in claim 1, wherein said discharging means include an electrode situated in a vicinity of said intensification means and a grounding line connected to said electrode and adapted to be coupled to said electrical reference of said equipment.

10. The solar generator as claimed in claim 9, wherein said grounding line is coupled to a measuring means adapted to measure the intensities and/or durations and/or creation dates and/or creation frequencies of said discharge currents.

11. The solar generator as claimed in claim 9, further comprising insulating means adapted to electrically insulate said grounding line from a rest of said solar generator.

12. The solar generator as claimed in claim 11, wherein said insulating means are adapted to provide double-isolation.

13. The solar generator as claimed in claim 9, wherein said electrode consists of a conductive plate including a central part and a peripheral part fastened to said intensification means.

14. The solar generator as claimed in claim 9, wherein said electrode is a photoelectric cell fastened to a rear face of said intensification means and configured to be electrically disconnected from the other photoelectric cells.

15. The solar generator as claimed in claim 1, wherein said at least two photoelectric cells comprise a semiconductor material.

16. The solar generator as claimed in claim 15, wherein said at least two photoelectric cells comprise gallium arsenide (AsGa) type.

17. The solar generator as claimed in claim 16, wherein said at least two photoelectric cells are of multijunction type.

18. A spacecraft, including at least one solar generator as claimed in claim 1.

* * * * *